United States Patent
Sombrin et al.

(10) Patent No.: US 8,976,895 B2
(45) Date of Patent: Mar. 10, 2015

(54) METHOD FOR CALIBRATING A LINEARIZER AND LINEARIZED ELECTRONIC COMPONENT

(71) Applicant: Centre National d'Etudes Spatiales, Paris Cédex (FR)

(72) Inventors: Jacques Sombrin, Toulouse (FR); Xavier Giraud, Versailles (FR); Alexandre Guerin, Toulouse (FR); Guy Lesthievent, Villate (FR); Jean-Pierre Millerioux, Toulouse (FR); Xavier Deplancq, Toulouse (FR)

(73) Assignee: Centre National d'Etudes Spatiales (FR)

( * ) Notice: Subject to any disclaimer, the term of this patent is extended or adjusted under 35 U.S.C. 154(b) by 0 days.

(21) Appl. No.: 13/904,216

(22) Filed: May 29, 2013

(65) Prior Publication Data

US 2013/0336422 A1    Dec. 19, 2013

(30) Foreign Application Priority Data

May 30, 2012 (FR) .................................... 12 54961

(51) Int. Cl.
*H04K 1/02* (2006.01)
*H04L 25/03* (2006.01)
*H04L 25/49* (2006.01)
*H04B 1/04* (2006.01)
*H03F 1/32* (2006.01)

(52) U.S. Cl.
CPC ............ *H04B 1/0475* (2013.01); *H03F 1/3247* (2013.01); *H03F 1/3288* (2013.01); *H04B 2001/0425* (2013.01)
USPC ..... 375/296; 375/224; 455/114.3; 455/115.2; 455/67.14

(58) Field of Classification Search
CPC ... H04L 27/368; H03F 1/3247; H03F 1/3241; H04B 17/00; H04B 17/001; H04B 2001/0408; H04B 2001/0425; H04B 2001/0433; H04B 2001/0441
USPC .................. 375/224, 285, 295–296; 330/149; 455/114.2, 114.3, 115.1, 115.2, 63.1, 455/67.11, 67.14
See application file for complete search history.

(56) References Cited

U.S. PATENT DOCUMENTS 6,885,709 B1 * 4/2005 Dartois .......................... 375/297
7,170,951 B1 * 1/2007 Perthold et al. ............... 375/296

(Continued)

FOREIGN PATENT DOCUMENTS

EP    2244380 A1    10/2010
GB    2335812 A     9/1999

(Continued)

*Primary Examiner* — Jean B Corrielus
(74) *Attorney, Agent, or Firm* — Cantor Colburn LLP

(57) ABSTRACT

Method for calibrating a linearizer and linearized electronic component the method comprises predistortion, in a predistortion linearizer, of a signal upstream of an electronic component to compensate nonlinear distortion. Determining predistortion setting parameters comprises applying a bifrequency test signal to the component and measuring the relative amplitudes of the lines at the output of the component. A variable indicative of the magnitude |Kp| of the AM/PM conversion coefficient of the component is calculated on the basis of these measurements. The predistortion setting parameters are adjusted so as to minimize |Kp|. The method may in particular be implemented in a linearized amplifier device and in an amplifier test bench.

19 Claims, 6 Drawing Sheets

(56) References Cited

U.S. PATENT DOCUMENTS

| | | |
|---|---|---|
| 7,974,592 B2 * | 7/2011 | Mege et al. ............... 455/114.3 |
| 8,711,904 B2 * | 4/2014 | Debaillie ..................... 375/219 |
| 2002/0012404 A1 * | 1/2002 | Ahn ............................ 375/297 |
| 2003/0197559 A1 * | 10/2003 | Ghannouchi et al. ........ 330/149 |
| 2005/0009479 A1 * | 1/2005 | Braithwaite .............. 455/114.3 |
| 2006/0034356 A1 * | 2/2006 | Fechtel ........................ 375/219 |
| 2006/0061418 A1 * | 3/2006 | Matsuura et al. ............ 330/149 |
| 2006/0240786 A1 | 10/2006 | Liu |
| 2007/0190952 A1 | 8/2007 | Waheed et al. |
| 2009/0058521 A1 | 3/2009 | Fernandez |
| 2012/0328050 A1 * | 12/2012 | Bai et al. ..................... 375/297 |
| 2013/0251066 A1 * | 9/2013 | Kim et al. .................... 375/297 |

FOREIGN PATENT DOCUMENTS

| | | |
|---|---|---|
| JP | 2002135063 | 5/2002 |
| WO | 2004040751 A1 | 5/2004 |

* cited by examiner

METHOD FOR CALIBRATING A LINEARIZER AND LINEARIZED ELECTRONIC COMPONENT

FIELD OF THE INVENTION

The invention relates in general to the compensation of nonlinear distortion. In particular, the invention is directed at linearization by predistortion, in particular at a method for calibrating a predistortion linearizer. Another aspect of the invention relates to a device which implements such a method.

BACKGROUND

The components of an analog transmission chain all exhibit a greater or lesser degree of nonlinear behavior depending on the specific features of the transmitted signal. For example, it is difficult to provide a transmission chain with linear behavior over a wide bandwidth and a large signal power range.

Typical examples of sources of nonlinear distortion are digital/analog or analog/digital converters and amplifiers, in particular power amplifiers. This is because the latter operate as close as possible to saturation in order to maximize the added power efficiency and operating an amplifier close to its saturation point introduces nonlinear distortion.

In the case of a digitally modulated signal, the most negative effects of nonlinearity are an increase in the error vector magnitude (EVM) and the constellation points moving closer together. In order to increase spectral efficiency, there has been a change in the field of high spectral efficiency modulation to amplitude and phase shift keying (APSK) constellations which have plots which are more spaced apart than M-PSK (m-state phase shift keying) constellation plots but are more sensitive to the effects of power amplifier nonlinearity.

Compensating for the nonlinearity of an electronic component by predistortion is a technique which is known per se. It involves placing a component, hereafter denoted predistortion linearizer, upstream of the electronic component whose nonlinearity is to be corrected. The predistortion linearizer applies predistortion to the signal, which predistortion will then, at least in part, be corrected by the distortion of the electronic component. The predistortion parameters are selected so as to make the assembly (i.e. the predistortion linearizer and the electronic component whose nonlinearity is to be corrected) as linear as possible.

Hereafter, a distinction will be drawn between the electronic component (to be linearized) and the assembly comprising the electronic component and the linearizer, which will be denoted "linearized electronic component". In the case of a (power) amplifier which is to be linearized, the assembly of linearizer and amplifier will therefore be denoted "linearized (power) amplifier".

The advantage of placing the linearizer upstream of the amplifier rather than downstream of it resides in the fact that the electrical efficiency of the amplifier is less impaired.

FIG. 1 shows, qualitatively, the amplitude transfer curve (AM/AM curve representing output amplitude as a function of input amplitude) and the phase transfer curve (AM/PM curve representing the phase difference of the output signal as a function of input amplitude) of a traveling-wave tube power amplifier (TWTA) (without memory effect). It will be noted that a solid state amplifier does not exhibit saturation. Its AM/AM and AM/PM curves would therefore differ qualitatively from those shown in FIG. 1.

FIG. 2 shows the AM/AM and AM/PM curves of an ideal or ideally linearized amplifier. The AM/AM curve is linear up to saturation and flat thereafter, while the AM/PM function is constant. It will be noted that it is not possible to obtain a linear AM/AM curve extending beyond the saturation power of the amplifier. The linearized AM/AM curve has to be limited to this maximum power value. It will, on the other hand, be noted that the linearized gain, i.e. the gradient of the AM/AM curve, is, in principle, a free parameter. Gain should, however, be kept as high as possible so as not to reduce electrical efficiency. It is thus attempted to preserve to the greatest possible extent the saturation gain of the nonlinear amplifier.

The predistortion linearizer has an AM/AM curve which is the inverse (in terms of the mathematical functions: $f^{-1}$) of the AM/AM curve of the amplifier and an AM/PM curve, as a function of the output power thereof, which is the opposite of the AM/PM curve of the amplifier. The AM/AM and AM/PM curves of the linearizer are shown qualitatively in FIG. 3.

Linearization cannot extend beyond amplifier saturation (the inverse of the AM/AM curve no longer exists). The linearizer is therefore preferably complemented by a power limiter.

The theoretical AM/AM curve of the linearizer is not accurately physically achievable up to saturation. A second, more realistic, AM/AM curve is shown in FIG. 3. It is, however, necessary to get as close as possible to the theoretical AM/AM curve in the vicinity of saturation because the operating points close to saturation are those where electrical efficiency is most favorable. This point is less difficult on a solid state amplifier which does not have a saturation threshold.

The linearizer may be set:
  once and for all at the start of operation of the linearizer-amplifier assembly. This variant has the disadvantage that variation in environmental conditions and drift over time of amplifier and linearizer characteristics may reduce linearization quality.
  once and for all at the start of operation, but for a range of parameters such as temperature, frequency, gain, etc. in order to obtain a set of AM/AM and AM/PM curves, from which is selected the one which is best suited to the environmental conditions measured during operation of the linearized amplifier.
  periodically, by one or more feedback loops in order to follow the variations, assumed to take place more slowly, in the environment and equipment characteristics.
  permanently by one or more feedback loops.

All previously known methods for calibrating predistortion linearizers directly measure the phase difference of the output signal relative to the input, either by using a laboratory instrument (network analyzer or vector voltmeter) at the start of operation, or by demodulating the output signal in order to obtain the channels I and Q (phase is then the argument of the complex number I+jQ) or alternatively the signal amplitude and phase.

Requirements for these calibration methods by phase measurement include:
  having a receiver/demodulator which may be a laboratory measuring instrument or alternatively the receiver of the transceiver in the case of bidirectional telecommunications equipment;
  defining specific measurement signals or alternatively using the signals, known in advance, which are already present in the useful signal such as synchronization pilots or rise and fall times;

defining a time and phase reference between the input and output signals and optionally calibrating said reference itself using specific signals.

Document WO 2004/040751 A1 describes a linearizer which combines a number of linearization principles, namely predistortion linearization, feed-forward linearization and feedback linearization. A predistortion linearized amplifier is included in a feed-forward correction loop, the assembly being corrected or calibrated by a feedback loop.

Patent application US 2007/0190952 A1 discloses a mechanism for calibrating a digital predistortion linearizer. The mechanism uses a receiver integrated in the RF chip to demodulate the amplified RF signal at the amplifier output. The I and Q channels arising from demodulation are used to calculate the amplitude and phase of the amplified signal. Linearization is carried out in a processor upstream of the digital-analog conversion of the signal to be amplified. The amplitude of the signal is set by a code which directly activates the amplifier, while phase is processed by a different channel and used as an amplifier input signal.

Patent application US 2009/0058521 A1 describes a method for reducing the nonlinear distortion of an electronic component by applying a stimulus signal to the input of the electronic component and analyzing the distortion undergone by the stimulus signal. A correction signal is determined on the basis of the observed distortion and added to the primary signal upstream of the nonlinear electronic component. The stimulus signal is a bifrequency signal, the components of which have the same power. A plurality of distortion measurements are carried out in a first phase while maintaining a fixed separation between the frequencies of the two components and varying the central frequency and in a second phase while keeping the central frequency fixed but varying the separation between the frequencies of the two components.

BRIEF SUMMARY OF THE INVENTION

The invention proposes a method for linearization by predistortion which makes it possible to adjust the setting of the linearizer located upstream of an electronic component to be linearized during operation of the latter in order to take account of equipment drift or in the event of a change in the environment, this being achieved without necessarily directly measuring the phase difference of the output signal relative to the input or demodulating the output signal.

According to the invention, a method for compensating the nonlinear distortion of an electronic component (e.g. an amplifier, in particular a power amplifier, or a converter, etc.) intended to produce an output signal linearly dependent on a signal to be converted, comprises the steps:
  a) converting, in the electronic component, a signal to be converted;
  b) predistorting at least part of the signal to be converted upstream of the electronic component, predistortion being set so as at least in part to compensate a nonlinear distortion of the electronic component; and
  c) determining predistortion setting parameters.
Determining Predistortion Setting Parameters Comprises:
  c1) applying a bifrequency test signal to the electronic component, said test signal comprising a first input signal component at a first frequency (designated $f_1$) and a second input signal component at a second frequency (designated $f_2$), the (power) level of the second input signal component being at least 10 dB (preferably at least 15 dB and still more preferably at least 20 dB) lower than the (power) level of the first input signal component, so as to obtain, at the output of the electronic component, an output signal comprising a first output signal component at frequency $f_1$, a second output signal component at frequency $f_2$, together with a third output signal component at a third frequency (designated $f_3$), symmetrical to the frequency $f_2$ in relation to the frequency $f_1$ (in other words: $f_3=2 f_1-f_2$);
  c2) measuring the relative (power) level of the second output signal component and the relative (power) level of the third output signal component, these relative levels being measured relative to the level of the first output signal component;
  c3) calculating a variable indicative of dissimilarity between the spectrum of the bifrequency test signal and the output signal arising from application of the bifrequency test signal to the electronic component, on the basis of said measurements;
  c4) predistorting the test signal by adjusting the predistortion setting parameters so as to minimize said dissimilarity;
the adjusted predistortion setting parameters being applied during predistortion of at least part of the signal to be converted.

The level of the second input signal component is preferably no more than 40 dB lower than the level of the first input signal component.

Steps c1) to c2) are advantageously carried out for a plurality of power levels of the bifrequency test signal, which makes it possible to reduce the dissimilarity of the input and output spectra over a range of input powers extending for example up to the saturation input power or up to the maximum service power of the electronic component. The variable indicative of dissimilarity may then be a function (inter alia) of the relative power levels of the second and third output signal components.

Preferably, the variable indicative of dissimilarity between the spectrum of the bifrequency test signal and the output signal arising from application of the bifrequency test signal to the electronic component is a variable indicative of the magnitude of the AM/PM conversion coefficient (i.e. the gradient of the AM/PM curve) of the electronic component. In this case, the test signal is predistorted by adjusting predistortion setting parameters so as to minimize the magnitude of the AM/PM conversion coefficient. It will be noted that minimizing the magnitude of the conversion coefficient amounts to making the AM/PM function of the linearized electronic component constant in the vicinity of a given input power. Preferably, steps c1) to c4) are then carried out for a plurality of power levels of the bifrequency test signal, which makes it possible to make the AM/PM function constant over a range of input powers extending up to the saturation input power or to the maximum service power of the electronic component. If the conversion coefficient is known for a sufficiently dense population of input powers, the AM/PM curve can be obtained by integration. According to a preferred embodiment of the invention, the sign of the AM/PM conversion coefficient of the electronic component is determined for each power level of the bifrequency test signal.

It will be understood that the method proposed for the purposes of the present invention does not involve direct measurement of phase on the converted signal (i.e. the output signal). The method therefore does not require a time or phase reference, which is difficult to achieve outside a laboratory. The invention will be of particular interest especially for use in onboard power amplifiers in satellites (for telecommunications or other purposes). This is because, due to the difficulties in implementing a time and phase reference and a calibrated phase measurement chain on a satellite, satellites do not at present have an amplifier linearizer setting loop. At present, the linearizers used in the space industry are calibrated once and for all on the basis of AM/AM and AM/PM curves measured in the laboratory (at a plurality of central frequencies, if needs be). The calculated predistortion parameters are stored in a nonvolatile memory (e.g. a field programmable gate array (FGPA)) of the linearizer. The predistortion parameters cannot at present be corrected in flight.

Thanks to the method described above, the AM/PM curve can be determined merely by carrying out spectral measurements, more specifically relative measurements of line amplitudes in the output spectrum of the electronic component.

The method is based in part on a measurement method described in the article: J. P. Laico, H. L. McDowell, and C. R. Moster, "A Medium Power Traveling-Wave Tube for 6000-Mc Radio Relay," Bell System Technical Journal, 3§(6), pp. 1285-1346, November 1956, which has since been used for orbital tests of the Symphonie satellite in 1977 and in general for TWTA or SSPA measurements in the article: A. A. Moulthrop, C. J. Clark, C. F. Silva, and M. S. Muha, "A Dynamic AM/AM and AM/PM Measurement Technique", IEEE MTT-S Digest, 1997, pp. 1455-1458. As far as the inventors are aware, the distortion measurement method described in these publications has never yet been used for the purposes of a setting method for a linearizer.

The method according to the invention makes it possible, for example, to set (recalibrate) an amplifier linearizer on a satellite in orbit in order to correct the consequences of aging, of a change in broadcasting frequency and/or a change in environmental conditions.

The intervals between two determinations of the predistortion setting parameters may be of greater or less length, depending on the needs of the application. Intervals in the range from a few seconds to several months are in principle possible. The intervals may be regular or irregular. It is also possible to only carry out recalibration under exceptional circumstances. Since the linearized electronic component cannot be operated normally when diagnostics are performed, the attempt will be made to reduce their frequency and duration to the greatest possible extent.

According to a preferred embodiment of the invention, determining predistortion setting parameters further comprises the steps:

c5) applying a monofrequency test signal to the electronic component;
c6) measuring the signal level obtained at the frequency of the monofrequency test signal at the output of the electronic component on application of the monofrequency test signal; and
c7) calculating a variable indicative of the AM/AM distortion (e.g. the compression or gradient of the AM/AM curve) of the electronic component on the basis of said measurement.

The predistortion setting parameters are then adjusted so as to minimize not only AM/PM distortion but also AM/AM distortion.

Steps c5) to c7) are preferably carried out for a plurality of power levels of the monofrequency test signal, which makes it possible to construct the AM/AM curve of the linearized electronic component.

Instead of or in addition to steps c5)-c7), a variable indicative of the AM/AM distortion of the electronic component could be calculated on the basis of the level measurement relating to the second output signal component and the level measurement relating to the third output signal component. Adjustment of the predistortion setting parameters which is carried out so as to minimize AM/AM distortion may comprise setting the compression or the gradient of the AM/AM curve to a predetermined, constant value for the different levels of the test signal.

The signal to be converted may comprise a carrier modulated by a modulating signal. Predistortion may comprise predistorting solely the modulating signal or predistorting the entire signal. In the first case, the predistortion linearizer is placed upstream of the modulator. In the second case, the carrier modulated by the modulating signal is subjected to predistortion downstream of the modulator.

Adjusting the predistortion setting parameters may involve calculating an AM/AM curve and an AM/PM curve of the electronic component. Furthermore, adjusting the predistortion setting parameters preferably involves calculating AM/AM and AM/PM curves which are respectively the inverse of the AM/AM and AM/PM curves of the electronic component.

The linearizer is then set such that its AM/AM curve is the inverse (in terms of the mathematical functions) of the AM/AM curve of the electronic component and that its AM/PM curve, as a function of the output power thereof, is the opposite of the AM/PM curve of the electronic component. It should be noted that the calculated AM/AM and AM/PM curves of the predistortion linearizer may be stored in the form of look-up tables (LUTs) in a memory of the linearizer.

Another aspect of the invention relates to a device configured so as to implement the described method. Such a device, hereafter denoted linearized electronic component, comprises:

an electronic component intended to produce an output signal linearly dependent on a signal to be converted;
a predistortion linearizer for predistorting at least part of the signal to be converted upstream of the electronic component, the predistortion linearizer being settable so as at least in part to compensate a nonlinear distortion of the electronic component; and
a calibration device configured to determine predistortion setting parameters and to set the linearizer accordingly.

The calibration device is configured to implement steps c1)-c4) and, optionally, steps c5)-c7) described above. The calibration device furthermore sets the linearizer by applying predistortion setting parameters to the linearizer for predistorting at least part of the signal to be converted.

Still another aspect of the invention relates to an amplifier test bench comprising a location for receiving an amplifier to be tested; a predistortion linearizer set up to predistort test signals to be applied to the amplifier to be tested when the amplifier to be tested is placed in its location, the predistortion linearizer being settable so as at least in part to compensate a nonlinear distortion of the amplifier, and a calibration device configured to determine predistortion setting parameters and to set the linearizer accordingly and to output indicators of residual nonlinearity. The calibration device is configured to implement steps c1)-c4) and, optionally, steps c5)-c7) described above. The calibration device furthermore sets the linearizer by applying predistortion setting parameters to the linearizer for predistorting the test signal.

With regard to frequencies $f_1$ and $f_2$, these are preferably selected as a function of spectral characteristics of the signal to be converted. For example, frequency $f_1$ may be selected to be identical to the carrier frequency of the signal to be converted. Frequency $f_2$ is selected within the bandwidth of the electronic component so as to maintain a certain minimum separation between $f_1$ and $f_2$, e.g.: $\Delta f=|f_2-f_1|>1$ MHz in the case of an electronic component having bandwidth of a plurality of MHz, so as not to excite resonance phenomena in the power supply system. If the electronic component is a broadband amplifier (>approximately 500 MHz), the AM/AM and AM/PM curves may vary significantly as a function of frequency. With an AM/AM curve and an AM/PM curve of the linearizer, good linearization is obtained over a band of approximately 500 MHz. In the event of the amplifier having a broad band, the method according to the invention may thus be carried out for a plurality of frequency pairs $f_1$ and $f_2$ judiciously distributed across the band.

BRIEF DESCRIPTION OF THE DRAWINGS

Other distinctive features and characteristics of the invention will be revealed by the detailed description of some advantageous embodiments given below by way of example, without any intention of limiting the scope of the invention as set out in the claims, with reference to the appended drawings, in which:

DETAILED DESCRIPTION

Figure 1:
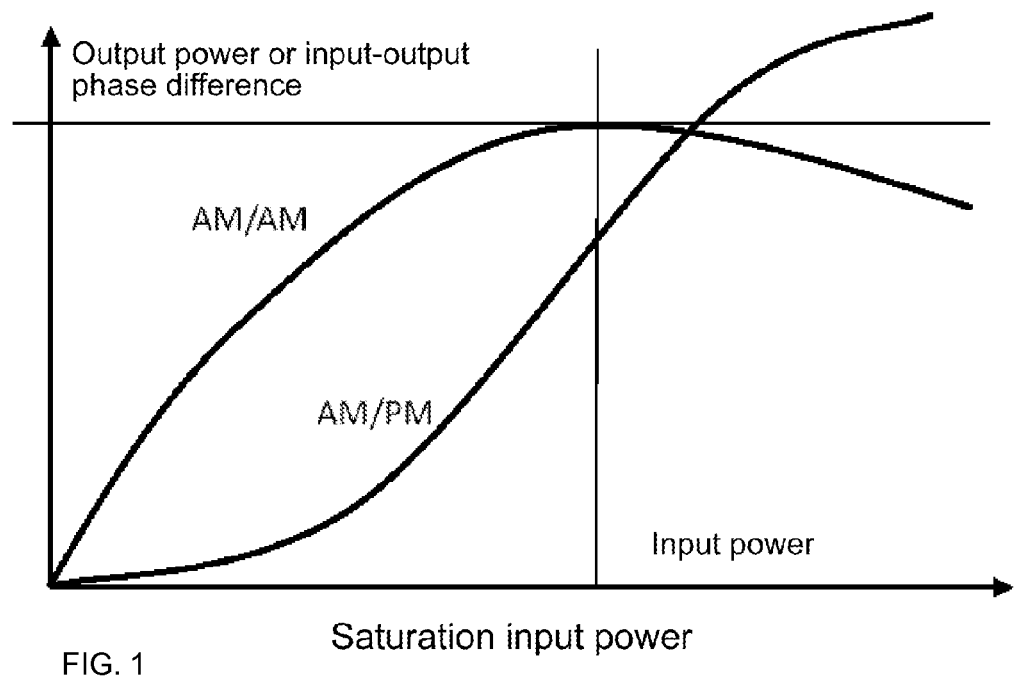
FIG. 1: is a qualitative representation of the AM/AM and AM/PM curves of a TWTA.
Figure 2:
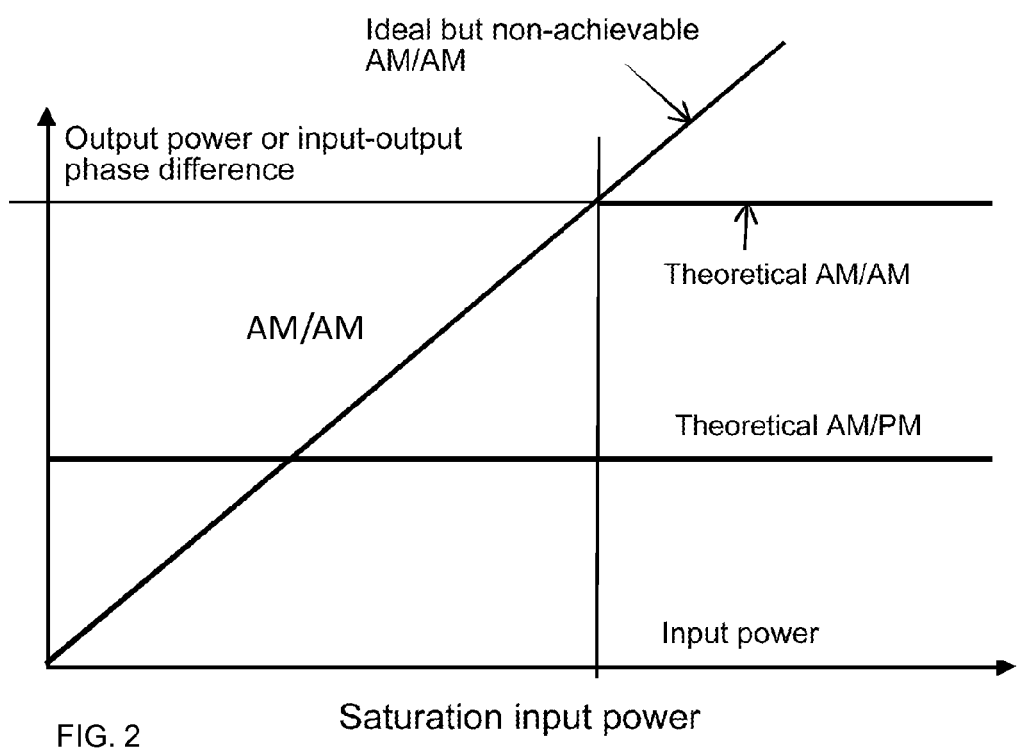
FIG. 2: is a qualitative representation of the AM/AM and AM/PM curves of an ideal or ideally linearized amplifier.
Figure 3:
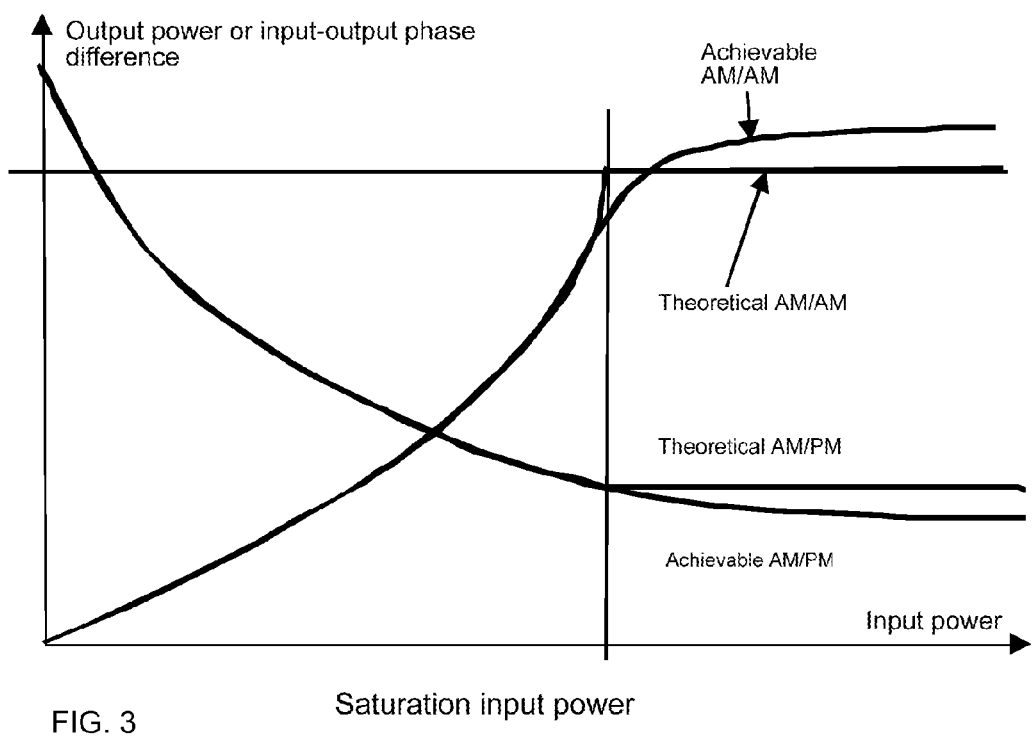
FIG. 3: is a qualitative representation of the AM/AM and AM/PM curves of a predistortion linearizer.

FIGS. 1 to 3 have already been discussed in the "Background" section.

Linearization of an Amplifier

Figure 4:
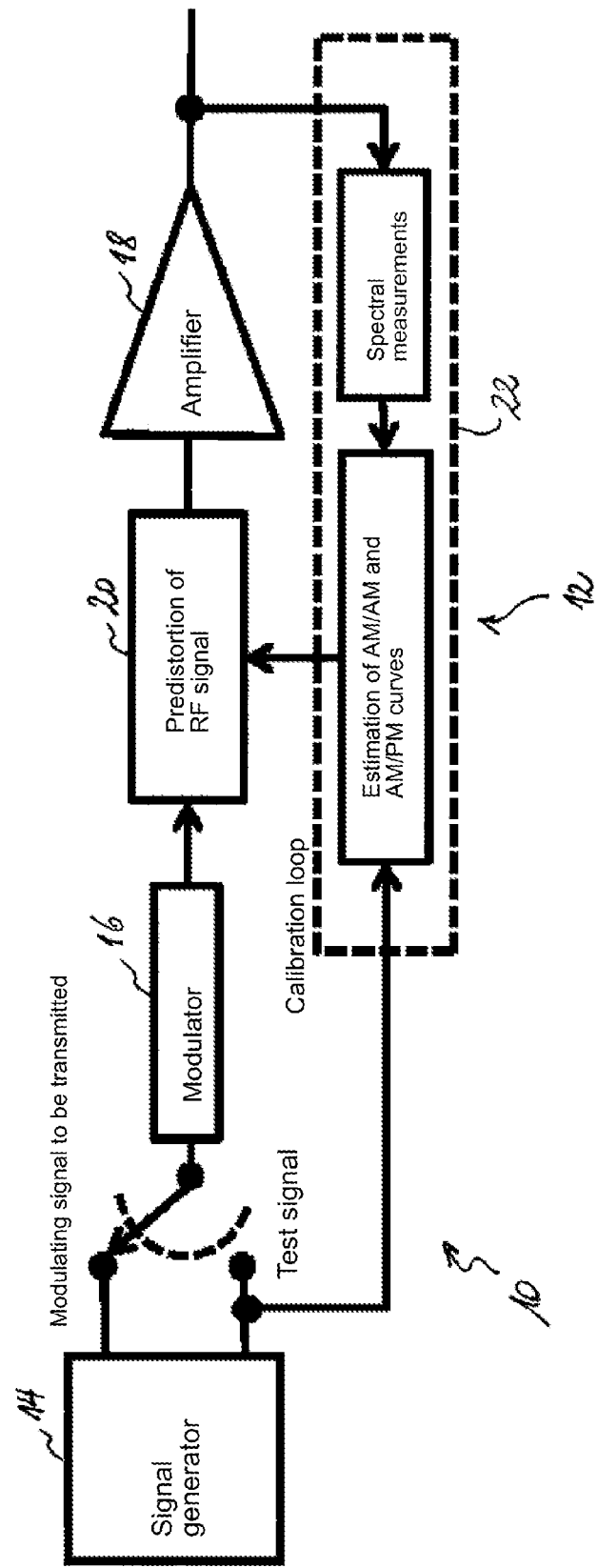
FIG. 4: is a schematic diagram of a transmission chain comprising a linearized amplifier device according to a first preferred embodiment of the invention.
Figure 5:
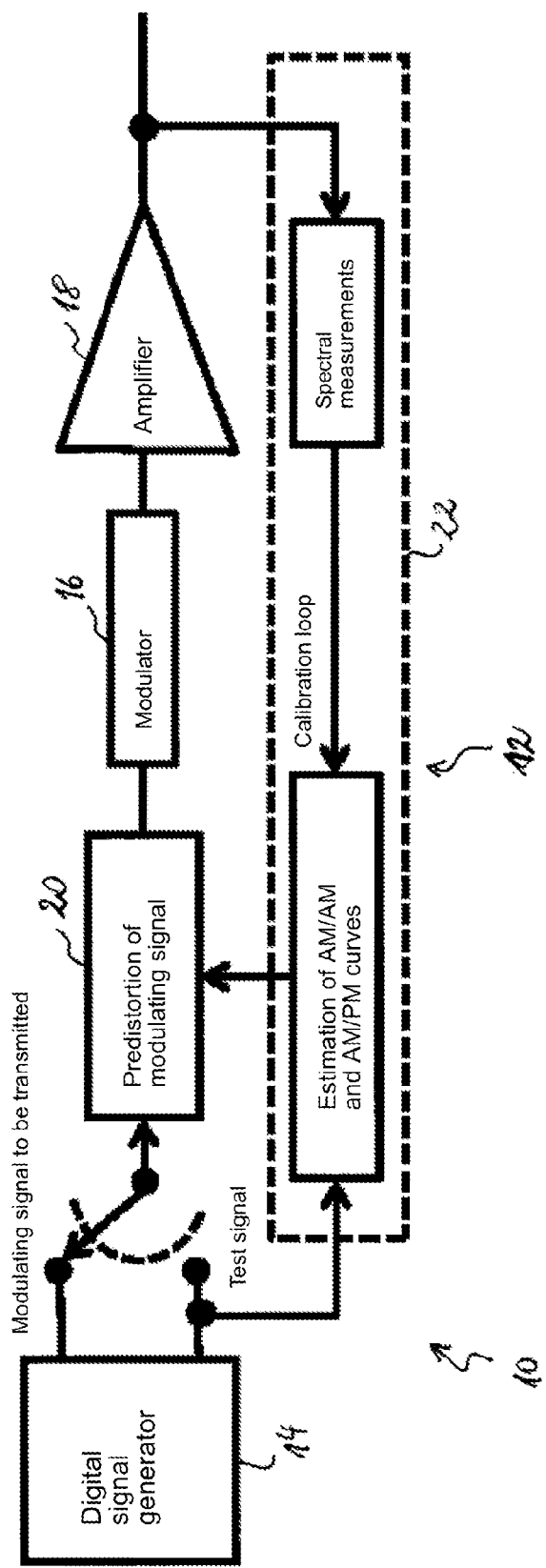
FIG. 5: is a schematic diagram of a transmission chain comprising a linearized amplifier device according to a second preferred embodiment of the invention.

A transmission chain 10 comprising a linearized amplifier device 12 according to a first and a second preferred embodiment of the invention is shown schematically in FIG. 4 and FIG. 5 respectively. The transmission chain 10 comprises a signal generator 14 which supplies a baseband signal (modulating signal). A modulator 16 modulates the modulating signal on a carrier. The resultant RF signal is amplified by a power amplifier 18. A predistortion linearizer 20 is located upstream of the amplifier 18 so as at least in part to compensate the nonlinear distortion added to the signal by the amplifier 18. According to the embodiment of the invention shown in FIG. 4, the predistortion linearizer 20 is placed downstream of the modulator 16 and therefore acts on the RF signal to be amplified. In FIG. 5, the predistortion linearizer 20 is placed upstream of the modulator 16 and acts only on the modulating signal. In the embodiment according to FIG. 4, a conventional RF linearizer may be used. In the embodiment according to FIG. 5, a digital predistortion linearizer, which is more flexible, may be used. Current digital linearizers, however, have the disadvantage of a narrower bandwidth.

The transmission chain comprises a calibration device 22 which controls the predistortion linearizer 20. The calibration device 22 is embodied as a loop which measures the nonlinear distortion of test signals and, on the basis of these measurements, determines the setting parameters for the predistortion carried out by the linearizer 20.

The generator generates test signals for the purpose of determining the predistortion setting parameters. Transmission of the modulating signal is interrupted while this diagnostic method is being carried out.

The predistortion linearizer may be set in different ways, explained in greater detail below.

1) Setting by Inverting the AM/AM and AM/PM Curves

According to a first possible method, the AM/AM and AM/PM curves of the linearized amplifier are subtracted from the measurements and the predistortion required to approximate these curves as closely as possible to the ideal curves is calculated (see FIG. 2).

The calibration device is configured to determine the AM/AM and AM/PM curves without making use of direct measurements of the phase of the amplified signal.

Determining the AM/AM curve involves applying a monofrequency test signal (having a single line spectrum preferably at the carrier frequency). The calibration device 22 measures the amplitude of this output line from the amplifier 18 by varying the power of the input monofrequency test signal. The AM/AM curve of the linearized power amplifier (i.e. the linearizer 20 followed by the amplifier 18) is obtained by calculating the ratio of the output line amplitude to the input line amplitude for a plurality of input powers.

Figure 6:
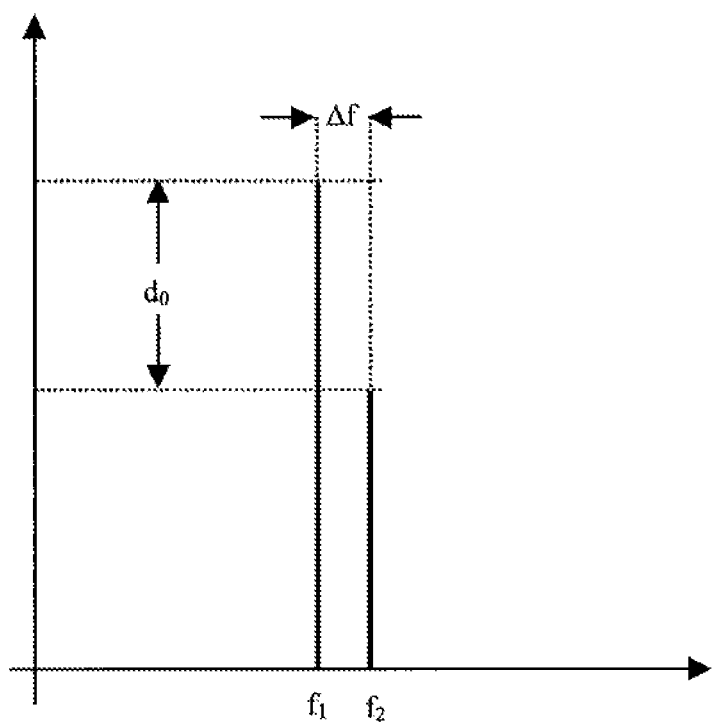
FIG. 6: is a qualitative representation of the spectrum of the bifrequency signal applied to the input of the amplifier for determining its AM/PM curve.

The AM/PM curve is determined indirectly. A method known from the Laico et al. article (complete reference above) is used. In this case, a bifrequency test signal is applied. The bifrequency test signal comprises a first input signal component at frequency $f_1$ and a second input signal component at frequency $f_2$. The corresponding spectrum is shown in FIG. 6. The line level at frequency $f_2$ is distinctly less than the line level at frequency $f_1$: $d_0 > 10$ dB, preferably $d_0 > 15$ dB or even $> 20$ dB.

Figure 7:
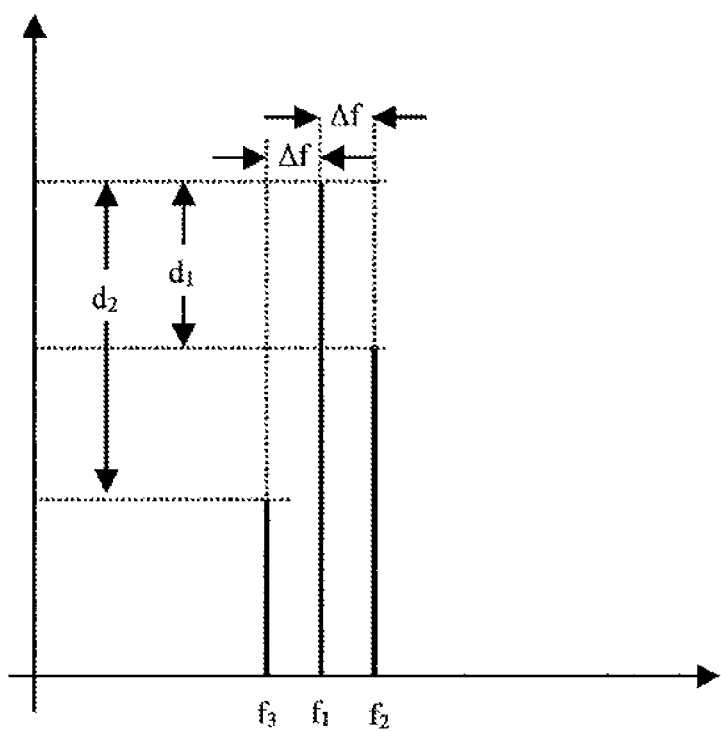
FIG. 7: is a qualitative representation of the output spectrum of the amplifier when the bifrequency signal of FIG. 6 is applied to the input.

The calibration device measures the relative amplitudes of the lines in the spectrum of the amplified test signal, shown in FIG. 7. Due to the nonlinearities, a third line appears in the spectrum of the amplified signal at a frequency of $f_3$, symmetrical to the frequency $f_2$ in relation to the frequency $f_1$ ($f_3 = 2 f_1 - f_2$). The calibration device measures the levels of the lines at frequencies $f_2$ and $f_3$ relative to the level of the central line.

The ratio between the line level at frequency $f_2$ and the level of the central line is designated $d_1$ and the ratio between the line level at frequency $f_3$ and the level of the central line is designated $d_2$. It is assumed that $d_1$ and $d_2$ (together with $d_0$) are expressed in dB. The magnitude of the conversion coefficient (i.e. the magnitude of the gradient of the AM/PM curve) may then be calculated by the following formula:

$$|K_p| = \frac{2}{0.152} \sqrt{S_1^2 - \left(\frac{1 + S_1^2 - S_2^2}{2}\right)^2}, \quad \text{(Eq. 1)}$$

where $K_p$ denotes the conversion coefficient in °/dB (the gradient of the phase difference in degrees per dB), and where $S_1^2 = 10^{(d_0-d_1)/10}$ and $S_2^2 = 10^{(d_0-d_2)/10}$.

The derivation of this formula is explained in the article by Laico et al. $|K_p|$ is determined for different input test signal powers (while keeping the ratio $d_0$ constant).

It should be noted here that the (AM/AM) compression, designated c, may also be calculated thanks to the values $S_1$ and $S_2$:

$$c = 1 - (S_1^2 - S_2^2). \quad \text{(Eq. 2)}$$

It is therefore possible to calculate the gradient of the AM/AM curve, designated $K_a$, and to subtract the AM/AM curve using the measurements $d_0$, $d_1$ and $d_2$ made on application of the bifrequency test signal. It is therefore not necessary for the purposes of determining the AM/AM curve to make use of the method which involves the application, described above, of a monofrequency test signal.

The AM/PM curve is obtained by integrating $K_p$ to within one additive constant (which may be fixed arbitrarily). Any doubt must therefore be eliminated regarding the sign of $K_p$ for each test signal input power value. It should be noted that the sign of $K_p$ is known and fixed for traveling-wave tube amplifiers but this is not the case for all types of amplifier. For example, the sign of $K_p$ for an SSPA ("solid-state power amplifier") is not constant over the entire AM/PM curve. (In other words, the AM/PM curve of an SSPA is not monotonic.) The same applies to a linearized TWTA; in this case, $K_p$ may change sign a number of times, but $|K_p|$ remains low (e.g. less than $1°/dB$).

One simple way of eliminating doubt regarding the sign of $K_p$ is to add thereto a value of known amplitude and sign, for example by causing the calibration device to act on the linearizer so as to modify the AM/PM correction curve of the predistortion linearizer) and to measure the new magnitude of the resultant coefficient $K_p$. Since the initial value $|K_p|$, the $|K_p'|$ value obtained after modifying the AM/PM correction curve and the sign of $K_p$-$K_p'$ are known, $K_p$ (and $K_p'$) may be obtained. It is optionally possible to improve accuracy with a third measurement by inverting the sign of the known quantity which is added.

Another more all-encompassing method involves calculating an AM/PM correction curve while assuming a positive $K_p$ value for each test signal input power and applying the correction obtained. It is then checked whether an improvement ($|K_p|$ close to $0°/dB$) is obtained with this correction for all the test signal input powers. At those test signal input powers where a deterioration is observed ($|K_p|$ increases), the sign is inverted. Instead of assuming all the values of $K_p$ to be positive, it is of course also possible to start with the opposite assumption.

Preferably, the measured values for the magnitudes of $K_p$ are compared with the measurement error, because there is no point in trying to find the sign of a $K_p$ coefficient (or of a residue of a $K_p$ coefficient after correction) if the magnitude is less than the measurement error. Elevated accuracy with regard to line amplitude must be obtained if the intention is to measure $K_p$ coefficients of a magnitude of less than $1°/dB$. It will indeed be noted that a measurement error of 0.2 dB results in a $K_p$ error of 0.1 to $0.6°/dB$ depending on $K_p$ and the compression. If $K_p$ is less than $1°/dB$, certain error combinations may give rise to a negative number under the radical of equation 1. If, in order to avoid this situation during performance of calibration, the absolute value of this number were imposed, a larger error would be made with regard to the small values of $K_p$. By comparing $|K_p|$ with the measurement error, a quick check may be made as to whether previously determined correction curves are still fit for purpose or alternatively whether a complete recalibration must be carried out. If the test is carried out with the previous correction curves and if a differential correction of zero or less than the measurement error is obtained, there is no point in changing the correction.

The invention makes it possible to vary the output power of the TWTA as well as the compensation of the channel amplifier gain at the linearizer output. Calibration then makes it possible to obtain AM/AM and AM/PM curves suited to this operating power, in a real environment and while taking account of amplifier aging.

2) Setting by Error Loop

When the predistortion linearizer setting is just about correct, the calibration loop can operate by comparing the AM/AM and AM/PM curves of the linearized amplifier with the linear AM/AM and ideal AM/PM curves. A quadratic error may then be calculated for example by summing the squares of the errors at each measurement point. Modifying the setting parameters of the predistortion linearizer leads to different errors. A measurement of the error gradient as a function of the setting parameters may then be obtained. This gradient may then be used for refining the setting or for monitoring changes in the environment or amplifier aging. In this operating mode, the calibration device functions as an error loop. Inverting (in terms of the mathematical functions) the AM/AM and AM/PM curves of the amplifier, the linearizer or the assembly of the two is not necessary for this operating mode.

For example, the measurements of $|K_p|$ and $K_a$ (gradient of the AM/AM curve in dB/dB) for M+N measurements as a function of input level (with N below saturation and M beyond saturation) may be used to calculate a quadratic error:

$$err^2 = \alpha\left[\frac{1}{M+N}\sum_{i=1}^{M+N} K_{p,i}^2\right] + \beta\left[\frac{1}{N}\sum_{i=1}^{N}(K_{a,i}-1)^2\right] + \gamma\left[\frac{1}{M}\sum_{i=N+1}^{M+N} K_{a,i}^2\right], \quad \text{(Eq. 3)}$$

where $err^2$ denotes the quadratic error and the parameters $\alpha$, $\beta$ and $\gamma$ must be adjusted depending on the significance attached to the phase and magnitude of the dynamic gain, below and above saturation. Errors of $1°/dB$ with regard to $K_p$ and 0.1 dB/dB with regard to $K_a$ are of the same order of significance. These orders of magnitude must thus be checked, for example by simulations.

The above quadratic error formula only involves the square of the conversion magnitude $K_p$. It is therefore unnecessary to eliminate any doubt regarding the sign thereof. On the other hand, it is recommended to replace $K_{p,i}^2$ by 0 or by the magnitude thereof if the square is negative so as not to disrupt calculation of the quadratic error with negative terms.

It is checked that the error is zero if the gradient of the AM/AM curve is constant (i.e. $K_a$=constant) from 0 to saturation and zero therebeyond and if the gradient of the AM/PM curve is zero everywhere ($K_p$=0).

Modifying the setting parameters of the predistortion linearizer yields a different quadratic error. It is then possible to obtain a measurement of the gradient of the quadratic error as a function of the linearizer setting parameters even if the effect of each setting on the AM/AM and AM/PM curves of the linearizer is not known.

This operating mode makes it possible to use any settable linearizer, including broadband analog linearizers, currently available but each setting of which acts simultaneously on the AM/AM curve and on the AM/PM curve, without there being any need to model this complex operation.

The gradient obtained on subsequent measurements may be used to refine the setting or to monitor changes in the environment or amplifier aging.

Gradient monitoring algorithms are well-known and their only drawback is the possibility of remaining stuck at a local minimum. This is likely to happen especially when there are a large number of parameters to be optimized. Numerous solutions for avoiding this problem have, however, been published.

The error loop operating mode is also usable for a more easily modeled digital linearizer because it makes it possible to avoid direct measurement of the phase curve or integration on the basis of the measurement of $K_p$ with elimination of doubt regarding sign and inversion of the AM/AM and AM/PM curves. The number of setting parameters must remain acceptable for the optimizer used, for example by providing models of the AM/AM and AM/PM curves or the inverse curves.

Another possibility for error loop operation is to base the reasoning solely on the measurement of the relative levels of the second and third output signal components from the amplifier obtained by application of the bifrequency test signal. The error loop attempts in this case to minimize a variable indicative of the dissimilarity of the input and output spectra (at least up to saturation) which does not depend (directly) on $K_p$ and/or $K_a$.

Below saturation (for N measurements), it is required that the relative level of the first carrier is identical to the relative level on input and that the power of the symmetrical carrier is zero. Beyond saturation (for M measurements), it is merely desired to preserve the phase modulation of the input signal, namely two carriers of the same amplitude and of a relative level for example 6 dB lower than that of the input carrier. The following may then be stated as the quadratic error function:

$$err^2 = \alpha \left[ \frac{1}{N} \sum_{i=1}^{N} (d_1 - d_0)^2 \right] + \beta \left[ \frac{1}{N} \sum_{i=1}^{N} d_2^2 \right] + \gamma \left[ \frac{1}{M} \sum_{i=N+1}^{M+N} \left( d_1 - \frac{d_0}{4} \right)^2 \right] + \delta \left[ \frac{1}{M} \sum_{i=N+1}^{M+N} \left( d_2 - \frac{d_0}{4} \right)^2 \right] \quad \text{(Eq. 4)}$$

Since this formula does not involve either of the coefficients $K_a$ or $K_p$, the calculation is always possible. On the other hand, the formula does not make it possible to assign a defined weight to the linearization of the AM/AM curve and to the linearization of the AM/PM curve.

It should also be noted that beyond saturation, this formula cannot guarantee that the modulation is solely phase modulation of the input signal; there could in fact be a combination of phase and amplitude modulation if the nonlinearity has memory. However, the same applies to the method based on $K_a$ and $K_p$.

Exemplary Embodiments

The calibration method presented in the context of the present document may be used to linearize a space industry amplifier (on board an orbiting satellite), for example a TWTA, or on a test bench. Other applications are, of course, possible. The principal advantage of the method is that direct phase measurement using a time and phase reference is not required.

At present, the performance of TWTAs is measured without a linearizer (by the tube manufacturer and then by the tube and power supply integrator). The customer then produces a linearized amplifier. The linearity performance of the tube alone is not representative of the performance which might be obtained after linearization.

It may, however, be contemplated to measure a TWTA "linearized as well as possible" by a given linearizer set as well as possible as a function of the measurement of the TWTA curves.

The method according to the invention makes it possible to provide a test bench which does not require a time and phase reference but which measures the nonlinearity of the tested device and corrects it automatically. Residual nonlinearity (after application of the identified best predistortion) may be used to specify the linearity performance of the device tested which has been "linearized as well as possible". Such a test bench is shown in FIG. 8.

Figure 8:
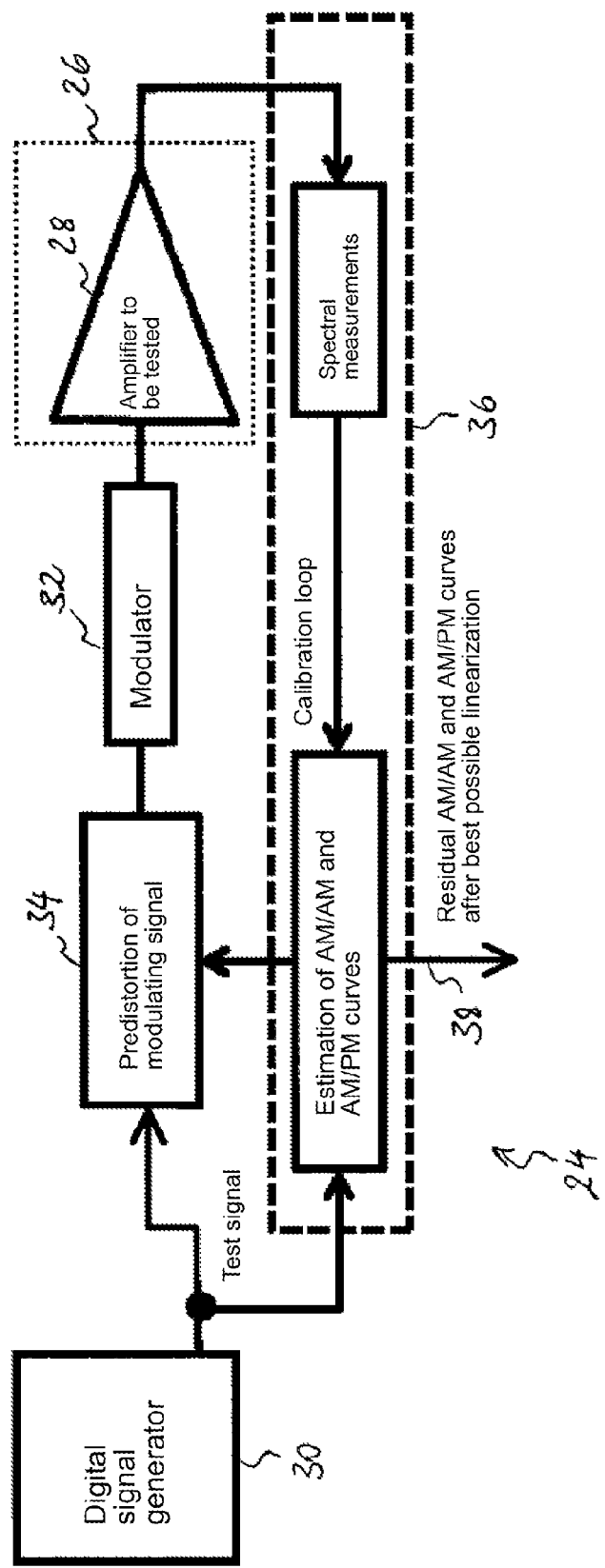
FIG. 8: is a schematic diagram of a test bench for amplifiers using the method according to the invention.

The test bench 24 which is shown in FIG. 8 is similar to the linearized amplifier device shown in FIG. 5. The test bench 24 comprises a location 26 for receiving an amplifier to be tested 28. A test signal generator 30 supplies a baseband test signal. A modulator 32 modulates the test signal onto a carrier. The resultant RF signal is applied to the amplifier 28 to be tested placed in the location provided for this purpose. A predistortion linearizer 34 is arranged upstream of the amplifier 28 to be tested so as to compensate the nonlinear distortion added to the RF signal by the amplifier 28 to be tested. The calibration device 36 which controls the predistortion linearizer 34 is provided as a loop which measures the nonlinear distortion of test signals and, on the basis of these measurements, determines the setting parameters of the predistortion carried out by the linearizer. The calibration device 36 furthermore comprises an output 38 on which it makes available indicators of residual nonlinearity, for example the AM/AM and AM/PM curves of the amplifier 28 to be tested after it has been linearized "as well as possible".

It remains to be noted that the test bench 24 could also be configured similarly to the linearized amplifier device shown in FIG. 4. The answer to the question as to which configuration should be preferred may depend on the type of amplifiers to be tested and their intended use.

Selection of the Amplitude of the Second Component of the Bifrequency Test Signal The bifrequency test signal (FIG. 6) comprises a first input signal component at a first frequency and a second input signal component at a second frequency, the level of the second input signal component being distinctly lower than the level of the first input signal component.

An excessively high amplitude of the second component relative to the first component amounts to measuring a mean of the $K_a$ or $K_p$ coefficient over a wide range of levels. This is because the second component may be interpreted, in part, as an amplitude modulation of the first component which is all the greater the higher is the level thereof.

The following correspondences have been identified between the relative level of the two components of the bifrequency test signal and the peak-to-peak amplitude modulation of the first component:

| Relative level (dB) | Relative amplitude of modulation | Peak-to-peak amplitude modulation (dB) |
| --- | --- | --- |
| 10 | 0.32 | 5.69 |
| 15 | 0.18 | 3.12 |
| 20 | 0.10 | 1.74 |
| 30 | 0.03 | 0.55 |

A level difference of 10 dB is usable but enables measurement of a mean gradient between two points located 3 dB above or below the mean level at which the measurement is made. A level difference of 15 dB provides a mean over plus or minus 1.5 dB. Level differences of 20 to 30 dB are preferred.

Measurement errors of the order of 0.1 to 0.5 dB with regard to the relative levels are generally acceptable but may lead to major errors with regard to $K_p$ coefficients of less than 0.5°/dB, including the impossibility of carrying out the calculation in accordance with the formula for the magnitude of $K_p$ (Eq. 1) in the event that the number from which the square root is extracted becomes negative. The calculation may be stabilized by adopting the absolute value of this number or, preferably, adopting 0 if said number is negative. This brings about an error over low values of $K_p$ (values less than 0.5°/dB). This error depends on the value of $K_p$ and on the compression. However, the mean error remains of the order of 0.5°/dB.

Since the second component must have sufficient amplitude to minimize errors over measurements of relative power, it is recommended not to reduce the level of the second component of the test signal to more than 40 dB below the first component of the test signal.

What is claimed is:

1. A method for compensating nonlinear distortion of an electronic component intended to produce an output signal linearly dependent on a signal to be converted, comprising:
   a) predistorting at least part of an input signal upstream of the electronic component to generate a predistorted signal based on predistortion parameters to compensate a nonlinear distortion of the electronic component;
   b) converting, in the electronic component, the predistorted signal; and
   c) determining the predistortion parameters, the determining of the predistortion parameters comprising:
      c1) applying a bifrequency test signal to the electronic component, said test signal comprising a first input signal component at a first frequency and a second input signal component at a second frequency, the level of the second input signal component being at least 10 dB lower than the level of the first input signal component, to obtain, at the output of the electronic component, the output signal comprising a first output signal component at said first frequency, a second output signal component at said second frequency, together with a third output signal component at a third frequency, symmetrical to the second frequency in relation to the first frequency;
      c2) measuring the relative level of the second output signal component and the relative level of the third output signal component, these relative levels being measured relative to the level of the first output signal component;
      c3) calculating a variable indicative of dissimilarity between the spectrum of the bifrequency test signal and the output signal arising from application of the bifrequency test signal to the electronic component, on the basis of said measurements;
      c4) predistorting the test signal by adjusting the predistortion parameters to minimize said dissimilarity; the adjusted predistortion parameters being applied during said predistortion of the signal.

2. The method according to claim 1, in which said variable indicative of dissimilarity is a variable indicative of the magnitude of an amplitude modulation to phase modulation (AM/PM) conversion coefficient of the electronic component and in which said dissimilarity is minimized by minimization of the magnitude of the AM/PM conversion coefficient.

3. The method according to claim 2, in which the determination of the predistortion parameters comprises
   c5) applying a monofrequency test signal to the electronic component,
   c6) measuring the signal level obtained at the frequency of the monofrequency test signal at the output of the electronic component on application of the monofrequency test signal;
   c7) calculating a variable indicative of amplitude modulation to amplitude modulation (AM/AM) distortion of the electronic component on the basis of said measurement corresponding to the mono frequency test signal;
   the predistortion parameters being further adjusted to minimize AM/AM distortion.

4. The method according to claim 2, in which determining predistortion parameters further comprises calculating a variable indicative of AM/AM distortion of the electronic component on the basis of the level measurement relating to the second output signal component and the level measurement relating to the third output signal component;
   and in which the predistortion parameters are further adjusted so as to minimize AM/AM distortion.

5. The method according to claim 1, in which said signal to be converted comprises a carrier modulated by a modulating signal and in which predistortion of at least part of the signal to be converted comprises predistortion of the modulating signal.

6. The method according to claim 1, in which said signal to be converted comprises a carrier modulated by a modulating signal and in which the carrier modulated by the modulating signal is subjected to said predistortion.

7. The method according to claim 1, in which steps c1) to c4) are carried out for a plurality of power levels of the bifrequency test signal.

8. The method according to claim 7, in which said variable indicative of dissimilarity is a variable indicative of the magnitude of an amplitude modulation to phase modulation (AM/PM) conversion coefficient of the electronic component, in which said dissimilarity is minimized by minimization of the magnitude of the AM/PM conversion coefficient, and in which the sign of the AM/PM conversion coefficient of the electronic component is determined for each power level of the bifrequency test signal.

9. The method according to claim 3, in which steps c5) to c7) are carried out for a plurality of power levels of the mono frequency test signal.

10. The method according to claim 9, in which said variable indicative of dissimilarity is a variable indicative of the magnitude of the AM/PM conversion coefficient of the electronic component, in which said dissimilarity is minimized by minimization of the magnitude of the AM/PM conversion coefficient, in which the sign of the AM/PM conversion coefficient of the electronic component is determined for each power level of the bifrequency test signal, and in which adjustment of the predistortion parameters involves calculating an AM/AM curve and an AM/PM curve of the electronic component.

11. The method according to claim 10, in which adjustment of the predistortion parameters involves calculating AM/AM and AM/PM curves which are respectively the inverse of the AM/AM and AM/PM curves of the electronic component.

12. The method according to claim 1, in which said electronic component is an amplifier, and in which said signal to be converted is a signal to be amplified.

13. The method according to claim 12, in which said amplifier is a power amplifier.

14. A linearized electronic component, comprising:
an electronic component intended to produce an output signal linearly dependent on a signal to be converted;
a predistortion linearizer for predistorting at least part of the output signal to be converted upstream of the electronic component, the predistortion linearizer being settable to compensate a nonlinear distortion of the electronic component; and
a calibration device configured to determine predistortion parameters and to set the linearizer accordingly;
the calibration device being configured to implement:
application of a bifrequency test signal to the electronic component, said test signal comprising a first input signal component at a first frequency and a second input signal component at a second frequency, the level of the second input signal component being at least 10 dB lower than the level of the first input signal component, so as to obtain, at the output of the electronic component, the output signal comprising a first output signal component at said first frequency, a second output signal component at said second frequency, together with a third output signal component at a third frequency, symmetrical to the second frequency in relation to the first frequency;
measurement of the level of the second output signal component and the level of the third output signal component;
calculation of a variable indicative of the magnitude of an amplitude modulation to phase modulation (AM/PM) conversion coefficient of the electronic component on the basis of said measurements;
predistortion of the test signal by adjusting the predistortion parameters to minimize the magnitude of the AM/PM conversion coefficient; and
setting of the linearizer by applying predistortion parameters to the linearizer for predistorting the signal.

15. The linearized electronic component according to claim 14, in which the calibration device is configured to implement:
application of a monofrequency test signal to the electronic component,
measurement of the signal level obtained at the frequency of the monofrequency test signal at the output of the electronic component on application of the monofrequency test signal;
calculation of a variable indicative of amplitude modulation to amplitude modulation (AM/AM) distortion of the electronic component on the basis of said measurement corresponding to the mono frequency test signal; and
adjustment of the predistortion parameters to minimize AM/AM distortion.

16. The linearized electronic component according to claim 14, in which said electronic component is an amplifier, said signal to be converted being a signal to be amplified.

17. The linearized electronic component according to claim 16, in which said amplifier is a power amplifier.

18. An amplifier test bench, comprising
a location for receiving an amplifier to be tested;
a predistortion linearizer set up to predistort test signals to be applied to the amplifier to be tested when the amplifier to be tested is placed in said location, the predistortion linearizer being settable to compensate a nonlinear distortion of the amplifier; and
a calibration device configured to determine predistortion parameters and to set the linearizer accordingly and comprising an output for outputting indicators of residual nonlinearity;
the calibration device being configured to implement:
application of a bifrequency test signal to the amplifier to be tested, said test signal comprising a first input signal component at a first frequency and a second input signal component at a second frequency, the level of the second input signal component being at least 10 dB lower than the level of the first input signal component, to obtain, at the output of the amplifier to be tested, an output signal comprising a first output signal component at said first frequency, a second output signal component at said second frequency, together with a third output signal component at a third frequency, symmetrical to the second frequency in relation to the first frequency;
measurement of the level of the second output signal component and the level of the third output signal component;
calculation of a variable indicative of the magnitude of an amplitude modulation to phase modulation (AM/PM) conversion coefficient of the amplifier to be tested on the basis of said measurements;
predistortion of the test signal by adjusting the predistortion parameters to minimize the magnitude of the AM/PM conversion coefficient; and
setting of the linearizer by applying predistortion parameters to the linearizer for predistorting the bifrequency test signal.

19. The test bench according to claim 18, in which the calibration device is configured to implement:
application of a mono frequency test signal to the amplifier to be tested,
measurement of the signal level obtained at the frequency of the monofrequency test signal at the output of the amplifier to be tested on application of the monofrequency test signal;
calculation of a variable indicative of amplitude modulation to amplitude modulation (AM/AM) distortion of the amplifier to be tested on the basis of said measurement corresponding to the monofrequency test signal; and
adjustment of the predistortion parameters to minimize AM/AM distortion.

* * * * *